(12) United States Patent
Reynoso et al.

(10) Patent No.: US 6,597,188 B1
(45) Date of Patent: Jul. 22, 2003

(54) GROUND LAND FOR SINGULATED BALL GRID ARRAY

(75) Inventors: Dexter Reynoso, Singapore (SG); Beng Kee Lim, Singapore (SG); Tuck Chee Albert Loh, Singapore (SG)

(73) Assignee: St Assembly Test Service Ltd., Singapore (SG)

( * ) Notice: Subject to any disclaimer, the term of this patent is extended or adjusted under 35 U.S.C. 154(b) by 0 days.

(21) Appl. No.: 09/658,890

(22) Filed: Sep. 11, 2000

(51) Int. Cl.[7] .............................................. G01R 31/02
(52) U.S. Cl. ........................ 324/755; 324/750; 324/759
(58) Field of Search ............................... 324/754, 755, 324/765, 158.1, 347, 375, 780, 759; 29/834, 424, 843, 884, 844, 845; 174/261; 228/188

(56) References Cited

U.S. PATENT DOCUMENTS

| | | | |
|---|---|---|---|
| 5,834,945 A | * 11/1998 | Akram | .................... 324/755 |
| 5,864,946 A | * 2/1999 | Eldridge | ....................... 29/834 |
| 5,983,493 A | 11/1999 | Eldridge et al. | ............... 29/855 |
| 5,985,695 A | 11/1999 | Freyman et al. | ............. 438/112 |
| 5,998,228 A | 12/1999 | Eldridge et al. | .............. 438/15 |
| 6,127,833 A | * 10/2000 | Wu | .............................. 324/755 |

* cited by examiner

*Primary Examiner*—Kamand Cuneo
*Assistant Examiner*—Trung Nguyen
(74) *Attorney, Agent, or Firm*—George O. Saile; Stephen B. Ackerman

(57) ABSTRACT

A new ground land is provided on the BGA package that allows for increasing the test sensitivity of a wire bond tester. The ground land is interconnected with a ground ring that is provided in the immediate vicinity of the BGA device. The ground land of the invention is provided such that the location of the ground land does not unduly interfere with essential functions and locations of other components that are required for the mounting of the BGA device, most preferably in a corner of the BGA device package.

9 Claims, 2 Drawing Sheets

GROUND LAND FOR SINGULATED BALL GRID ARRAY

BACKGROUND OF THE INVENTION (1) Field of the Invention

The invention relates to the fabrication of integrated circuit devices and more particularly, to a new construction for a ground connection that will enable effective and rapid evaluation of wire bond related defects.

(2) Description of the Prior Art

Quad Flat Packages (QFP) have in the past been used to create surface mounted, high pin count integrated packages with various pin configurations. The electrical connections with these packages are typically established by closely spaced leads that are distributed along the four edges of the flat package. This limits the usefulness of the QFP since a high I/O count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

The development of the Ball Grid Array (BGA) devices has offered the opportunity to spread device I/O interconnect points over the entire surface of the device, this as opposed to having I/O connect points available only around the periphery of the IC device. Typically, the BGA package is surface mounted on a motherboard (a Printed Circuit Board or PCB). The concerns of making reliable I/O interconnects are thereby shifted from fine pitch in-line lines to-contact balls. General sizes that are currently in use for Quad Flat Pack (QFP) packages are a footprint in the 25×25 mm range, a lead pitch of around 0.5 mm while the package itself is about 2 mm thick. A typical ball pitch for a BGA package is around 1.5 mm, with a footprint similar in size to the QFP package and a package thickness similar or slightly less than the thickness of a QFP package.

In order to test a BGA device, the contactor elements of the BGA device are inserted into a contactor plate having a plurality of sockets. The contactor plate is coupled to a Device Under Test (DUT) loadboard, which is coupled to a testing machine. The DUT loadboard is in essence a printed circuit board that completes electrical connections between the BGA contactor elements via the contactor plate and the tester. In order to test the BGA device, the tester sends signals to and receives signals from the BGA device via the electrical conductor paths provided by the contactor plate and the DUT board.

In assembling a BGA package to a PCB, the lower surface of the PCB is typically provided with contact balls that connect to an interfacing network of conducting lines that connect to surrounding electrical components or systems. A typical PCB contains two layers of interconnect metal. A cavity is typically formed in the upper surface of the PCB, the semiconductor device that is to be mounted on the PCB is inserted into this cavity. The contact balls of the BGA make electrical contact with the layers of interconnect metal in the PCB, the BGA die is further wire bonded to the PCB and enclosed in a molded casing. The operation of wire bonding limits the size of the surface on which the wire is connected, which in turn increases the size of the die that can be used. The side of the BGA that faces the PCB in this arrangement is the backside of the IC die, heat exchange between the BGA die and the underlying PCB takes place through this interface of the BGA die with the PCB. Since signal lines (in the PCB) are typically of fine line construction, these lines do not lend themselves to provide a good path for heat exchange. The heat exchange between the BGA and the PCB must therefore depend on (wider or larger in cross section) ground planes in the PCB, which brings with it limitation on the space that is available to route signal lines in the PCB.

At present the final testing of semiconductor Integrated Circuits is performed using Integrated Circuit Handler apparatus whereby each of the IC packages is handled as an individual unit and is advanced to the test socket of the DUT by either gravity feed or by using pick and place methods.

Mass production of semiconductor Integrated Circuits (IC's) brings with it the requirement that these IC's can be tested at high speed. Current trends in the semiconductor industry also promote convenient and bulk handling of semiconductor chips. While high speed testing has been current practice in the industry for a number of years, this testing in most cases handles individual chips. While in the test position, the chips must be contacted in a rapid and dependable way so that the chip can be tested. This contacting of the chip while the chip is in the position where it can be tested is done by means of probe sockets. These probe sockets are required to rapidly and dependably contact the semiconductor devices under test for the purpose of testing these devices.

During testing of the BGA device, it is important that proper ground connection are provided between the device under test and the test equipment. One of the assembly aspects of mounting a BGA device on a PCB is to test the quality of connection that is made in wire bonding the BGA device to the PCB. This connection must be a low resistivity connection, which means that the detection of non-stick conditions, whereby the wire bond connection is a high resistivity connection, is required. Current design for the testing of singulated ball grid array devices has no ground land connection on the BGA assembly. This ground land connection is required in order to activate the test capability of a wire bond apparatus that tests for high quality wire bond connections to the BGA device. This lack of a ground land on the BGA assembly makes the detection of the non-stick condition difficult and unreliable. The groung land of the invention addresses this problem by providing a ground land on the BGA assembly, which allows for activation of the test capability of the wire bond apparatus that evaluates the resistivity of the wire bond connections that have been made to the BGA device. The quality of the wire bonding process can therefore be readily monitored.

U.S. Pat. No. 5,998,228 (Eldridge et al.) shows a method of testing a separated a chip that uses a ground.

U.S. Pat. No. 5,983,493 (Eldridge et al.) shows a singulated BGA chip and method for testing using a ground.

U.S. Pat. No. 5,985,695 (Freyman et al.) teaches a method for making a BGA that uses a ground.

SUMMARY OF THE INVENTION

A principle objective of the invention is to provide a dependable method of evaluating the wire bond connections that have been made to a BGA device.

In accordance with the objectives of the invention a new ground land is provided on the BGA package that allows for activating the test capability of the wire bond machine.

DESCRIPTION OF THE PREFERRED EMBODIMENTS

Figure 1:
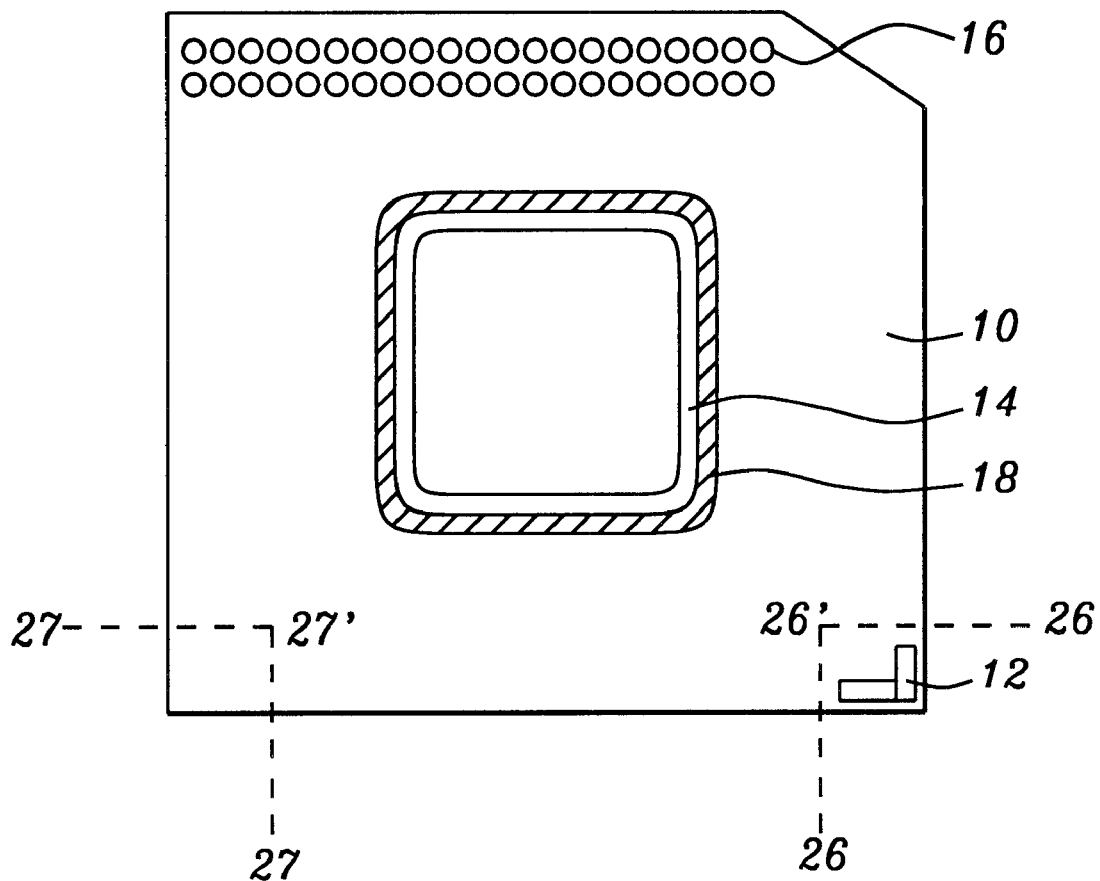
FIG. 1 shows a top view of a BGA assembly with the inclusion of the ground land of the invention.

In the typical process of creating semiconductor devices, multiple devices are created in the surface of a substrate. The created devices must be tested in order the select the functional and non-functional devices that are contained in the substrate. This testing uses a wafer tester whereby the tester makes a plurality of pressure point contact with to a equal plurality of connection points or bond pads that are for this purpose provided on the individual semiconductor dies. In this manner, the semiconductor die can be functionally tested or the die can be subjected to a process of burn-in that is used to further condition the functionality of the die. The wafer tester uses probes that are connected to a probe card, a plurality of probe elements are connected to the probe card. The tips of the probes make pressure contact with the test points on the surface of the semiconductor dies.

Wire bond pads are used to connect the semiconductor die to externally located and surrounding electronic circuitry and components. A wire is for this purpose connected to the wire bond pad whereby this wire leads to the indicated surrounding electronic circuitry and components. It is clear that the connection that is make between the bond pad and the bonded wire that is connected to the bond pad must be a low-resistivity connection in order to avoid negatively affecting circuit performance due to this connection. The path that leads from the test probe through the to be tested bond pad through the support package on which the BGA device is mounted to the tester that performs the subject test (of the quality/resistivity of the interface between the bonded wire and the bond pad) must therefore be a low resistance path. This implies that the resistance that is encountered between the support package for the BGA device and the ground of the test equipment that is used to perform the bond pad connection resistance test must be as low as possible. The invention is therefore limited to providing a ground land for singulated BGA packages and does not address any of the numerous aspects of BGA device or packaged device testing such as probe design and the therewith connected spring contact elements or structures, test boards, interconnection elements, probe tip structure, probe cards and the like.

The above can be summarized as follows:

- the die is inserted (in, for instance, a cavity that is provided for this purpose in the BGA package)
- a bond wire is connected to the die.
- the other end of the bond wire is connected to the substrate lead
- the test system applies a current between the bond wire and the (connected) die in order to validate the connection that has been made to the die. It the tester finds a good (low resistivity) connection, the wire bonding operation continues to the next bond connection that must be provided to the BGA die. If the tester finds a bad connection, that is high resistivity or an open connection, the sequence of providing wire bond connections is stopped and an operator intervenes.

The test system that is used to perform the above indicated sequence of bond wire validations needs a good, low resistivity ground connection in order to effectively perform these tests. Without such a ground connection, the validity of all the tests that are performed is questionable. The invention addresses this problem by providing a solid and low resistivity ground connection.

Referring now specifically to FIG. 1, there is shown a top view of a BGA assembly 10 with the inclusion of the ground land 12 of the invention. The solder ball connections 16 are the points of interface between the BGA package 10 and the surrounding circuitry and components to which the BGA device is connected. The BGA device (not shown in FIG. 1) is inserted into cavity 14 and connected, via wire bond connections, to the network of interconnect metal lines that is provided in several layers that form the package 10. These interconnect metal lines (not shown in FIG. 1) connect the wire bonded BGA device to the solder ball points of contact 16 from where the BGA device is integrated into the surrounding electronic circuitry. The objective of the test that is subject of the invention is, as previously stated, to test the resistivity of the wire bond connections. To make this test a meaningful and sensitive test, the potential resistivity that is present in the wire bond connection (to the wire bond pad) must be identifiable as being large with respect to all other resistivity that is encountered in the test path that leads from the test probe to the tester. The resistivity that is therefore present in the interface between the package 10 and the tester must be as low as possible. This objective is achieved by providing the ground land 12 which provides for a low resistivity connect between package 10 and the ground of the tester.

Figure 2:
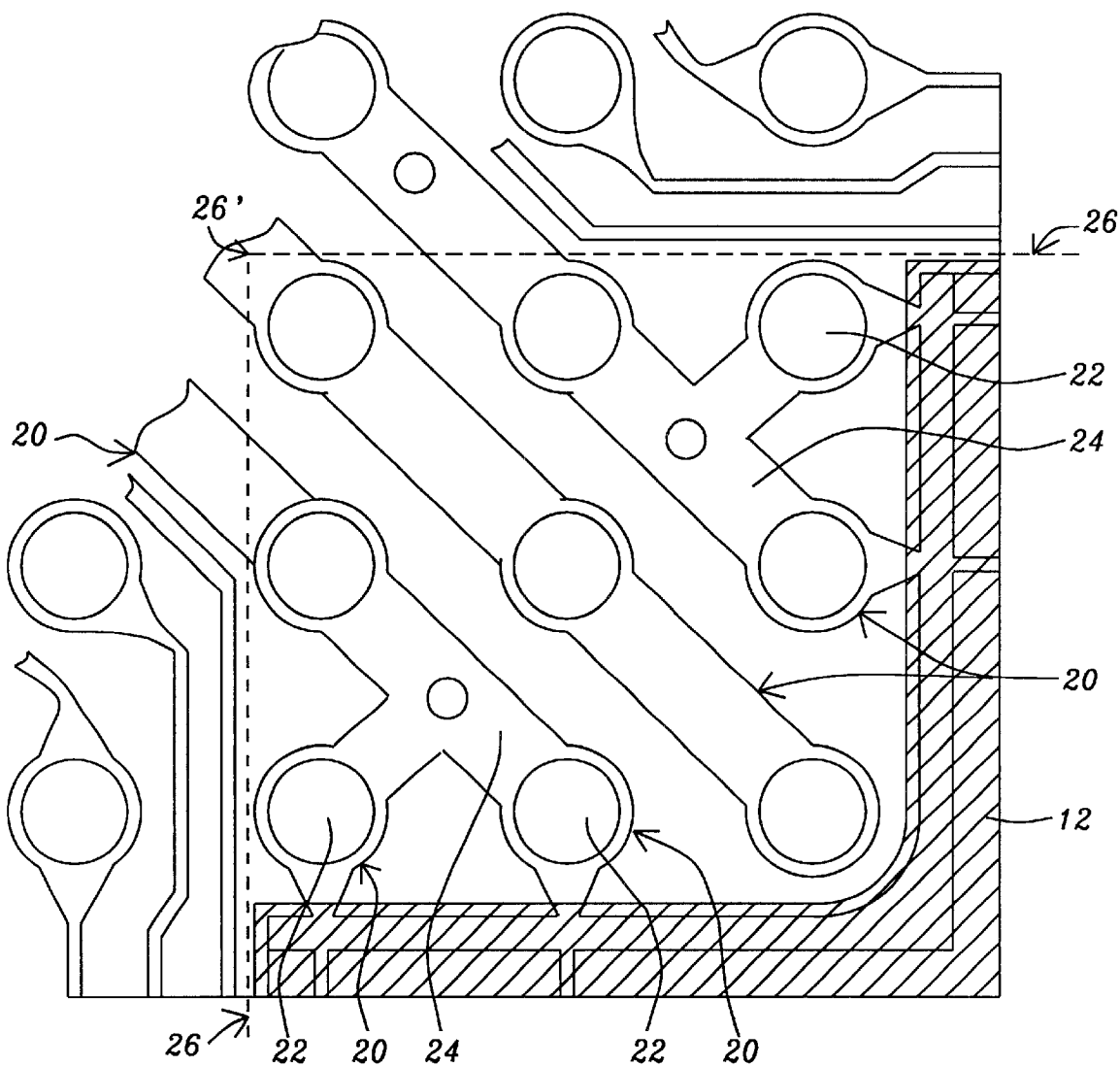
FIG. 2 shows a detailed top view of a BGA assembly with the ground pattern and the ground land of the invention.

The ground land 12 of the invention is bounded by boundaries 26–26' shown in FIGS. 1 and 2. These boundaries contain a surface area of the BGA assembly 10 that is typically a non-functional surface area of the BGA assembly 10. A non-functional surface area of the BGA assembly 10 is thereby defined as a surface area of the BGA assembly that is not used for the creation of active conductive interconnects over the surface thereof, such as the creation of signal lines or power lines or ground lines that are not connected with the ground land of the invention. This surface area that is bounded by boundaries 26–26' typically is a location that does not vary with different BGA supporting (assembly) package designs. As an alternate to such a location that does not vary with different BGA supporting package designs can also be selected a location bounded by boundaries 27–27' FIG. 1, assuming that the location that is bounded with boundaries 27–27' meets the requirement that the ground land 12 of the invention is provided over a surface area of the BGA supporting assembly 10 that does not vary with different BGA supporting package designs. For locations of the ground land 12 that meet the dual requirement of 1) not covering a functional surface area of the BGA supporting assembly and 2) being located in a surface area of the supporting BGA assembly that does not vary with varying BGA supporting package designs, the location of the ground land area can be determined based on BGA tester requirements. This assures ready conversion and universal applicability between a BGA device tester and the BGA supporting assembly 10.

As shown in FIG. 1, a ground ring 18 is provided around the periphery of the cavity 14 into which the die is inserted. This ring 18 is, in typical applications, surrounded by one or more concentric rings (not shown in FIG. 1) for further interconnect of the BGA device. The ground ring 18 forms the reference ground for the test system, this ground must therefore be a low resistivity ground between the tester and the surrounding components. In order to assure the low resistivity of this ground ring 18, the method of the invention has provided the ground land 12 that is shown in FIG. 1.

FIG. 2 further highlights the implementation of the ground land 12 and the traces 22 that are connected between the ground ring 18 (FIG. 1) and the ground pad 12. The ground land 12 is indicated in FIG. 2. The ground pattern 20 contains Au and Ni coated solder pads 22 and the (typically copper) traces 24 that lead to the ground ring 18 (FIG. 1). The pattern 20 that is shown in FIG. 2 is therefore the pattern of ground traces that interconnects the ring 18 with the ground land 12.

The traces, patterns and contact points that are shown in FIG. 2 and that have not been highlighted are not germane to the method and apparatus of the invention and are therefore not further discussed at this point.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An apparatus for testing singulated Ball Grid Array devices that have been mounted in a BGA supporting package, comprising inclusion of a Ground Land Connection as part of said BGA supporting package whereby said Ground Land Connection:

has an exposed surface area;

is interconnected with a ground ring that is provided surrounding the immediate circumference of said BGA device after said BGA device has been mounted in a BGA package; and contains gold thereby, providing a low-resistivity path between said BGA supporting package and said tester.

2. The apparatus of claim 1, said Ground Land Connection being provided in a non-functional surface area of said BGA supporting package, said non-functional surface area of said BGA supporting package being a surface area of the BGA supporting package not being used for creation of conductive interconnects over the surface thereof, said conductive interconnects being selected from the group consisting of signal lines and power lines and ground lines not being connected with the Ground Land Connection.

3. The apparatus of claim 1, said Ground Land Connection being provided in a location of the BGA supporting package that does not vary with different BGA supporting package designs.

4. The apparatus of claim 1, said Ground Land Connection being provided in a location being determined with respect to a BGA tester, thereby making application of said Ground Land Connection universal for and independent of BGA supporting package design.

5. A method for testing a singulated Ball Grid Array device, comprising:

providing a tester whereby said tester is provided with BGA device testing capabilities thereby including the ability to test for resistivity of wire bond to bond pad interface;

providing a BGA supporting package whereby said BGA supporting package includes a Ground Land Connection.

6. The method of claim 5 wherein said Ground Land Connection of said BGA supporting package:

has an exposed surface area;

is interconnected with a ground ring that is provided surrounding the immediate circumference of said BGA device after said BGA device has been mounted in a BGA package; and contains gold thereby providing a low-resistivity path between said BGA supporting package and said tester.

7. The method of claim 6, said Ground Land Connection being provided in a non-functional surface area of said BGA supporting package, said non-functional surface area of said BGA supporting package being a surface area of the BGA supporting package not being used for creation of conductive interconnects over the surface thereof, said conductive interconnects being selected from the group consisting of signal lines and power lines and ground lines not being connected with the Ground Land Connection.

8. The method of claim 6, said Ground Land Connection being provided in a location of the BGA supporting package that does not vary with different BGA supporting package designs.

9. The method of claim 6, said Ground Land Connection being provided in a location being determined with respect to a BGA tester, thereby making application of said Ground Land Connection universal for and independent of BGA supporting package design.

* * * * *

UNITED STATES PATENT AND TRADEMARK OFFICE
CERTIFICATE OF CORRECTION

PATENT NO. : 6,597,188 B1
DATED : July 22, 2003
INVENTOR(S) : Reynoso et al.

It is certified that error appears in the above-identified patent and that said Letters Patent is hereby corrected as shown below:

Column 1,
Line 38, delete "to-contact" and insert therefor -- to contact --

Column 2,
Line 12, insert -- a -- between "it" and "limitation"
Line 47, delete "groung" and insert therefor -- ground --

Column 3,
Line 54, delete "die." and insert therefor -- die --

Column 5,
Line 37, delete "thereby," and insert therefor -- thereby --

Signed and Sealed this

Eighth Day of March, 2005

JON W. DUDAS
*Director of the United States Patent and Trademark Office*